(12) United States Patent
Kim et al.

(10) Patent No.: US 7,564,053 B2
(45) Date of Patent: Jul. 21, 2009

(54) PHOTO-REACTIVE ORGANIC POLYMERIC GATE INSULATING LAYER COMPOSITION AND ORGANIC THIN FILM TRANSISTOR USING THE SAME

(75) Inventors: Gi Heon Kim, Daejeon (KR); Sung Min Yoon, Daejeon (KR); Kyung Soo Suh, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 108 days.

(21) Appl. No.: 11/188,912

(22) Filed: Jul. 25, 2005

(65) Prior Publication Data

US 2006/0060841 A1 Mar. 23, 2006

(30) Foreign Application Priority Data

Sep. 22, 2004 (KR) .................... 10-2004-0075938

(51) Int. Cl.
*H01L 51/30* (2006.01)
*G03C 1/00* (2006.01)
(52) U.S. Cl. .............. 257/40; 257/E51.007; 430/270.1
(58) Field of Classification Search .................. 257/40, 257/E51.001–E51.052; 438/82, 99; 430/270.1
See application file for complete search history.

(56) References Cited

U.S. PATENT DOCUMENTS

| | | | | |
|---|---|---|---|---|
| 5,876,900 A | * | 3/1999 | Watanabe et al. | 430/288.1 |
| 5,928,837 A | * | 7/1999 | Sato et al. | 430/270.1 |
| 5,981,970 A | * | 11/1999 | Dimitrakopoulos et al. | 257/40 |
| 6,621,098 B1 | * | 9/2003 | Jackson et al. | 257/40 |
| 6,727,042 B2 | * | 4/2004 | Takagi et al. | 430/280.1 |
| 6,764,885 B2 | * | 7/2004 | Huang et al. | 438/161 |
| 7,118,937 B2 | * | 10/2006 | Jang et al. | 438/99 |
| 7,238,961 B2 | * | 7/2007 | Bernds et al. | 257/40 |
| 2004/0023151 A1 | * | 2/2004 | Takeda et al. | 430/270.1 |
| 2004/0222412 A1 | * | 11/2004 | Bai et al. | 257/40 |
| 2005/0277245 A1 | * | 12/2005 | Ohta et al. | 438/222 |

FOREIGN PATENT DOCUMENTS

| | | |
|---|---|---|
| JP | 2004-107257 | 4/2004 |
| KR | 1999 021118 | 3/1999 |
| KR | 10-20030016981 | 3/2003 |
| KR | 20030016981 | 3/2003 |
| KR | 1020030033423 A | 5/2003 |
| KR | 10-20040028010 | 4/2004 |
| KR | 1020040028010 | 4/2004 |
| KR | 1020040062190 A | 7/2004 |
| KR | 1020040067047 | 7/2004 |
| WO | WO 02065557 A1 * | 8/2002 |
| WO | WO 2004019667 A1 * | 3/2004 |
| WO | WO 2005023876 A2 * | 3/2005 |

* cited by examiner

*Primary Examiner*—Douglas M Menz
*Assistant Examiner*—Matthew W Such
(74) *Attorney, Agent, or Firm*—Ladas & Parry LLP

(57) ABSTRACT

Provided are a composition for a photo-reactive organic polymeric gate insulating layer and an organic thin film transistor using the same. The composition for the photo-reactive organic polymeric gate insulating layer comprises poly (vinyl) phenol and a photo-reactive material, and the organic thin film transistor has a photo-reactive organic polymeric gate insulating layer formed of the composition. The composition for the photo-reactive organic polymeric gate insulating layer can add the photo patterning characteristics to an organic polymer and can form the layer with the enhanced electrical characteristics.

14 Claims, 3 Drawing Sheets

PHOTO-REACTIVE ORGANIC POLYMERIC GATE INSULATING LAYER COMPOSITION AND ORGANIC THIN FILM TRANSISTOR USING THE SAME

CROSS-REFERENCE TO RELATED APPLICATION

This application claims priority to and the benefit of Korean Patent Application No. 2004-75938, filed sep. 22, 2004, the disclosure of which is incorporated herein by reference in its entirety.

BACKGROUND

1. Field of the invention

The present invention relates to a composition for a photo-reactive organic polymeric gate insulating layer and an organic thin film transistor using the same, and more particularly, to a composition for a photo-reactive organic polymeric gate insulating layer formed by mixing poly (vinyl) phenol as a material for organic polymeric gate insulating layer with a photo-reactive material to allow a photo patterning characteristic of the organic polymer and to enhance an insulating characteristic, and an organic thin film transistor using the same.

2. Discussion of related art

Worldwide researches have been actively conducted on organic thin film transistors using an organic material as an active layer since 1988.

The organic thin film transistor has a structure almost similar to that of a conventional silicon-thin film transistor (Si-TFT) but differs from the conventional structure in that it uses an organic material instead of silicon in a semiconductor region. A printing process or a spin coating process at an atmospheric pressure instead of physical and chemical vapor deposition methods employed for the formation of an inorganic thin layer of the conventional si-tft can be applied to manufacture the organic thin film transistor so that a manufacturing process can be simplified and the process can be carried out at a low temperature. When such advantages are employed, a roll-to-roll process using a plastic substrate can be implemented and it can also be applied to a large-sized flat panel display.

It is expected that the organic thin film transistor can be applied as an essential component of a plastic circuitry of a memory device included in an active matrix (AM) display, an automatic teller machine, an identification tag, and so forth. The organic thin film transistor can be easily assembled, has mechanical flexibility, and can be manufactured at a low temperature. The organic thin film transistor has several associated characteristics, and an efficiency of the organic thin film transistor is affected by a degree of crystallization of an organic active layer, a charge characteristic of an interface between an organic insulating layer and the organic active layer, a thin film characteristic of the organic insulating layer, carrier injection capability of an interface between the organic active layer and source and drain electrodes, and so forth. Several methods are thus attempted in order to improve such characteristics.

A material is required which has a low electrical conductivity and a high breakdown field to be used as a gate insulating layer of the organic thin film transistor. A silicon oxide layer has been in use up to now as the gate insulating layer of the organic thin film transistor, however, in order to lower a threshold voltage, the family of ferroelectric insulators including $Ba_xSr_{1-x}TiO_3$ barium strontium titanate (BST), $Ta_2O_5$, $Y_2O_3$, $TiO_2$, and an inorganic dielectric material with a high dielectric constant such as $PbZr_xTi_{1-x}O_3$ (PZT), $Bi_4Ti_3O_{12}$, $BaMgF_4$, $SrBi_2(Ta_{1-x}Nb_x)_2O_9$, $Ba(Zr_{1-x}Ti_x)O_3$ (BZT), $BaTiO_3$, $SrTiO_3$, $Bi_4Ti_3O_{12}$ are currently employed (see U.S. Pat. No. 5,946,551, Korean Patent Publication Nos. 2002-0084427 and 2002-0034873).

Up until now, the silicon oxide layer is used as the gate insulating layer of the organic thin film transistor, however, in a case of an inorganic insulating layer, it is formed at a high temperature so that it may affect a substrate (in particular, a plastic substrate) and physical/chemical properties of other layers formed on the substrate in a pre-process (hereinafter, a pre-process layer) to thereby affect the characteristic of the transistor when it is applied to the organic thin film transistor. Accordingly, researches on a new organic gate insulating layer are widely conducted which can implement a low temperature process to minimize an influence on the pre-process layer.

Polyimide (Korean Patent Publication No. 2003-0016981), poly (vinyl) alcohol (Korean Patent Publication No. 2002-0084427), poly(vinylphenol-maleimide) (Korean Patent Publication No. 2004-0028010), photoacryl and so forth are employed as the organic insulating layers in recent years, however, which did not exhibit a device characteristic enough to replace the conventional inorganic insulating layers. Accordingly, in order to implement an organic thin film transistor having high efficiency, development on an organic gate insulating layer having a good device characteristic and allowing a simplified process to form the thin layer without affecting the substrate and the pre-process layer as well as development on an organic active layer material are immediately required.

Accordingly, the present inventors have conducted a research on an organic polymeric gate insulating layer for implementing the organic thin film transistor with high efficiency, and have found that a layer can be formed which allows the photo patterning characteristics to be added to the organic polymer and allows the insulating characteristics to be enhanced when a photo-reactive material is added to poly (vinyl) phenol as the gate insulating layer material and that this can be applied to the organic thin film transistor to thereby yield an enhanced device characteristic.

SUMMARY OF THE INVENTION

The present invention is directed to a composition for a photo-reactive organic polymeric gate insulating layer capable of adding the patterning characteristics to an organic polymer and enhancing the insulating characteristics.

The present invention is directed to an organic thin film transistor with the enhanced device characteristics by including the photo-reactive organic polymeric gate insulating layer.

One aspect of the present invention is to provide a composition for a photo-reactive organic polymeric gate insulating layer comprising poly (vinyl) phenol and a photo-reactive material of 0.1% or more based on weight of the poly (vinyl) phenol.

Another aspect of the present invention is to provide an organic thin film transistor comprising a substrate; a gate electrode; a photo-reactive polymeric gate insulating layer formed of the composition comprising poly (vinyl) phenol and a photo-reactive material; an organic active layer; and source and drain electrodes.

BRIEF DESCRIPTION OF THE DRAWINGS

The above and other characteristics and advantages of the present invention will become more apparent to those of ordinary skill in the art by describing in detail preferred embodiments thereof with reference to the attached drawings in which.

DETAILED DESCRIPTION OF PREFERRED EMBODIMENTS

Figure 1:
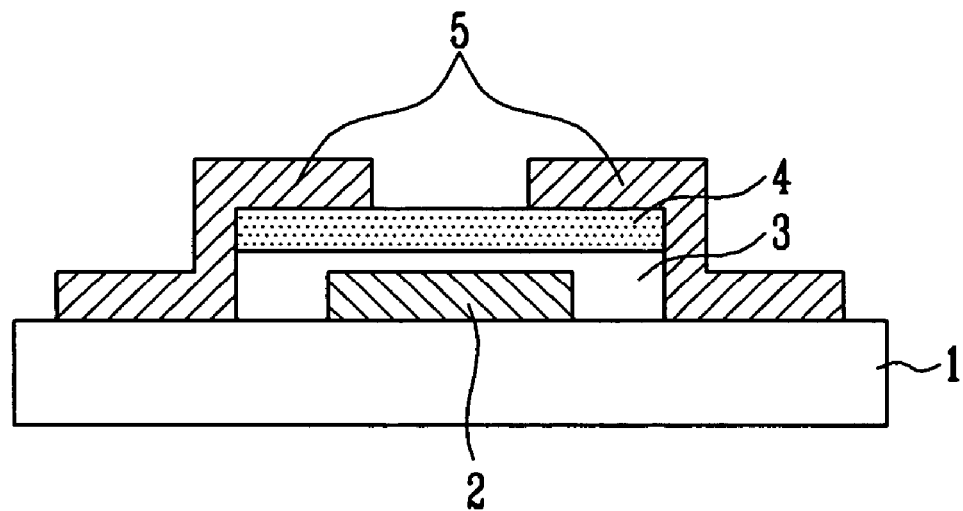
FIG. 1 is a cross-sectional view illustrating a structure of an organic thin film transistor in accordance with an exemplary embodiment of the present invention.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure is thorough and complete and fully conveys the scope of the invention to those skilled in the art.

According to one aspect of the present invention, a composition for a photo-reactive organic polymeric gate insulating layer is formed by adding a photo-reactive material to poly (vinyl) phenol represented by a chemical formula I:

Chemical Formula I

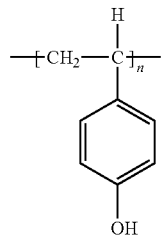

(I)

wherein n is ten or more.

The poly (vinyl) phenol may also be referred to as polyhydroxyl styrene. A degree of polymerization of the poly (vinyl) phenol is not limited but may be determined in response to used purpose and use, and it should be at least ten.

The poly (vinyl) phenol is dissolved in a solvent having a good coating characteristic at a concentration of 1% or more. Typical solvents used in the art may be employed as the solvent having a good coating characteristic, and dimethylformamide (DMF) is preferably used for the solvent. The coating characteristic and a thickness of the thin layer can be ensured only when the concentration of the poly (vinyl) phenol in the solvent is 1% or more.

When the poly (vinyl) phenol is used as the gate insulating layer, it may be physically blended with other polymers in consideration of physical, chemical, and electrical properties of the organic insulating layer. Accordingly, a content of containing the poly (vinyl) phenol is preferably 1 to 99 wt % of the total weight of the composition in consideration of the property change of the poly (vinyl) phenol.

By using the photo-reactive material in the composition for the photo-reactive organic polymeric gate insulating layer according to the present invention, a photo patterning characteristic can be added while an electrical characteristic is enhanced.

The photo-reactive material having such characteristics may be a little different from each other in response to kinds of the photo-reactive material to be used, however, h preferably has an amount of 0.1% based on weight of the poly (vinyl) phenol. Photo reaction can occur only when 0.1% or more of the photo-reactive material based on weight of the poly (vinyl) phenol is added to the poly (vinyl) phenol, and a proper amount of the photo-reactive material can be determined by used purpose of composition, use, kind and amount of components, and so forth.

The photo-reactive material to be used is preferably selected in the following materials which are activated by lights having a visible ray wavelength:

2,6-bis(4-azidobenzylidene)cyclohexanone;
2,6-bis(4-azidobenzylidene)-4-methylcyclohexanone;
4,4-diazidostilbene-2,2'-disulfonic acid disodium salt;
ammonium dichromate;
1-hydroxy-cyclohexyl-pentyl-keton (IRGACURE®907);
2-methyl-1 [4-(methylthio)phenyl]-2-morpholinopropane-1-one (IRGACURE®184C);
2-hydroxy-2-methyl-1-phenyl-propane-1-one (DUROCUR® 1173);
a mixed initiator (IRGACURE® 500) of 50 wt % of IRGACURE® 184C and 50 wt % of benzophenone;
a mixed initiator (IRGACURE® 1000) of 20 wt % of IRGACURE® 184C and 80 wt % of DUROCUR® 1173;
2-hydroxy-1-[4-(2-hydroxyethoxy)phenyl]-2-methyl-1-propanone (IRGACURE® 2959);
methylbenzoylformate (DUROCUR® MBF);
alpha, alpha-dimethoxy-alpha-phenylacetophenone (IRGACURE®651);
2-benzyl-2-(dimethylamino)-1-[4-(4-morpholinyl)phenyl]-1-butanone (IRGACURE® 369);
a mixed initiator (IRGACURE® 1300) of 30 wt % of IRGACURE® 369 and 70 wt % of IRGACURE® 651;
diphenyl (2,4,6-trimethyibenzoyl)-phosphine oxide (DUROCUR® TPO);
a mixed initiator (DUROCUR® 4265) of 50 wt % of DUROCUR® TPO and 50 wt % of DUROCUR® 1173;
a phosphine oxide;
phenyl bis(2,4,6-trimethyl benzoyl) (IRGACURE® 819);
a mixed initiator (IRGACURE® 2005) of 5 wt % of IRGACURE® 819 and 95 wt % of DUROCUR® 1173;
a mixed initiator (IRGACURE® 2010) of 10 wt % of IRGACURE® 819 and 90 wt % of DUROCUR® 1173;
a mixed initiator (IRGACURE® 2020) of 20 wt % of IRGACURE® 819 and 80 wt % of DUROCUR® 1173;
bis (etha 5-2,4-cyclopentadiene-1-yl) bis[2,6-difluoro-3-(1H-pyrrole-1-yl)phenyl]titanium (IRGACURE® 784);
a mixed initiator containing benzophenone(HSP 188); and derivatives thereof.

The photo-reactive organic polymeric gate insulating layer formed of the composition comprising poly (vinyl) phenol and a photo-reactive material may be applied to an organic thin film transistor.

FIG. 1 is a cross-sectional view illustrating a structure of an organic thin film transistor in accordance with an exemplary embodiment of the present invention.

Referring to FIG. 1, the organic thin film transistor has a structure in which a substrate 1, a gate electrode 2, a gate insulating layer 3, an organic active layer 4, and source and drain electrodes 5 which are sequentially stacked as shown in FIG. 1, or a structure that a substrate 1, a gate electrode 2, a gate insulating layer 3, source and drain electrodes 5, and an organic active layer 4 which are sequentially stacked, however, not limited thereto but may have another structure.

Each layer is shown to facilitate recognition in the drawing and has a thickness different from an actual corresponding layer.

Typical materials for substrates known in the art such as glass, silicon wafer, plastic or the like are used as the substrate 1, however, not limited thereto.

In addition, the gate electrode 2 is formed on the substrate 1 using typical methods such as an e-beam method via a shadow mask, and typical metals known in the art such as gold (Au), silver (Ag), nickel (Ni), indium-tin-oxide (ITO), aluminum (Al), titanium (Ti), titanium nitride (TiN), or chromium (Cr) is employed as the gate electrode 2, however, not limited thereto.

The gate insulating layer 3 is formed on the gate electrode 2, and a photo-reactive organic polymeric gate insulating layer formed of the composition in which a photo-reactive material is added to poly (vinyl) phenol is employed as the gate insulating layer 3.

In this case, 0.1% or more of the photo-reactive material based on weight of the poly (vinyl) phenol is added to the poly (vinyl) phenol, thereby yielding the photo-reactive organic polymeric gate insulating layer which has a patterning characteristic and an enhanced electrical characteristic in response to the addition of the photo-reactive material. In addition, examples mentioned above may be employed as the photo-reactive material.

Figure 2:
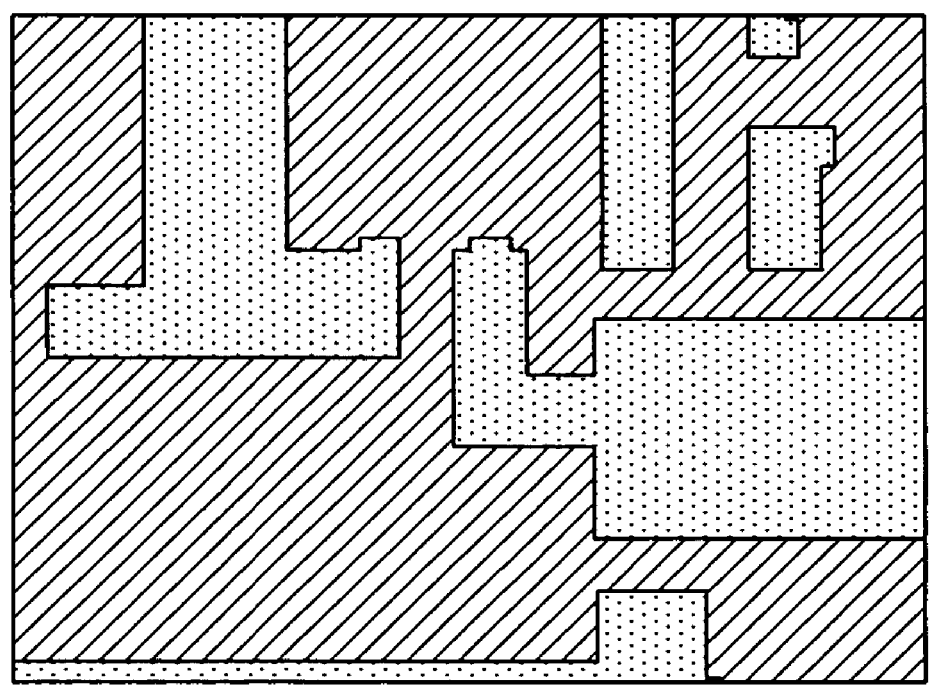
FIG. 2 is an optical microscope image of a patterned photo-reactive organic polymeric gate insulating layer.

The photo-reactive organic polymeric gate insulating layer is formed on the gate electrode using a wet process such that the composition for the gate insulating layer is applied on the gate electrode by spin-coating, dipping, or printing method, and then baked to thereby form the insulating layer. In addition, the photo-reactive organic polymeric gate insulating layer is patterned using a lithography process. An image of the photo-reactive organic polymeric gate insulating layer patterned by the lithography process is shown in FIG. 2.

The organic active layer 4 is formed on the gate insulating layer 3, and typical materials such as pentacene, dihexylsexithiophene (DH6T), poly(3-hexylthiophene) regioregular (P3HT), poly-9,9-dioctylfluorene-co-bithiophene (F8T2), dihexylanthra-dithiophene (DHADT), or derivatives thereof may be employed as a material for forming the organic active layer 4, however, not limited thereto.

The organic active layer 4 may be formed using a method like depositing the above-described materials under a condition well known in the art.

In addition, typical metals such as Au, ITO, Al, Cr may be employed as the source and drain electrodes 5, however, not limited thereto.

The source and drain electrodes 5 are formed on the organic active layer 4 using a method well known in the art, and may be preferably formed using an e-beam method via a shadow mask.

Each thickness of the substrate 1, the gate electrode 2, the gate insulating layer 3, the organic active layer 4, and source and drain electrodes 5 may be determined as a thickness well known in the art.

Example 1

Fabrication of a composition for a photo-reactive organic polymeric gate insulating layer 16 wt % of poly (vinyl) phenol was dissolved in DMF, and 16 wt % of 4,4'-diazidostilbene-2,2'-disulfonic acid disodium salt based on weight of poly(vinyl) phenol was added to the poly (vinyl) phenol so as to have a photo-reactivity, thereby forming the composition for the photo-reactive organic polymeric gate insulating layer.

Fabrication of an organic thin film transistor

A gate electrode formed of Ti(50 Å)/Au(500 Å) was first formed on a plastic substrate (poly(ether sulfone)) using an E-beam method via a shadow mask.

The composition fabricated by the above-described process was then coated with a thickness of 3700 Å on the gate electrode using a spin coating of 3000 rpm, and was baked for 10 minutes at 150° C. A local photocrosslinking reaction was then carried out by irradiating the resultant thin layer using a high pressure mercury lamp via a photomask, and a non-irradiated region was removed using methanol, thereby forming a polymeric gate insulating layer. Pentacene was then deposited with a thickness of 1000 Å on under conditions of a low degree of vacuum ($<1.0 \times 10^{-6}$ Torr), a substrate temperature of 70° C. And a deposition rate 1 Å/sec, thereby forming a pentacene active layer. The source and drain electrodes having a thickness of 500 Å were formed using gold (Au) having a channel width of 2 mm and a channel length of 100 μm by an E-beam method using a shadow mask.

Experimental Example

Measurement of a leakage current density characteristic

In order to measure an electrical characteristic of the gate insulating layer formed of the composition comprising poly (vinyl) phenol and a photo-reactive material, a leakage current density (J-V) and capacitance-voltage were measured.

The thin layer formed of the composition of the Example 1 was employed as a measurement sample, and a thin layer only formed of poly (vinyl) phenol was also used for comparison. This comparison result was shown in FIGS. 3 and 4.

Figure 3:
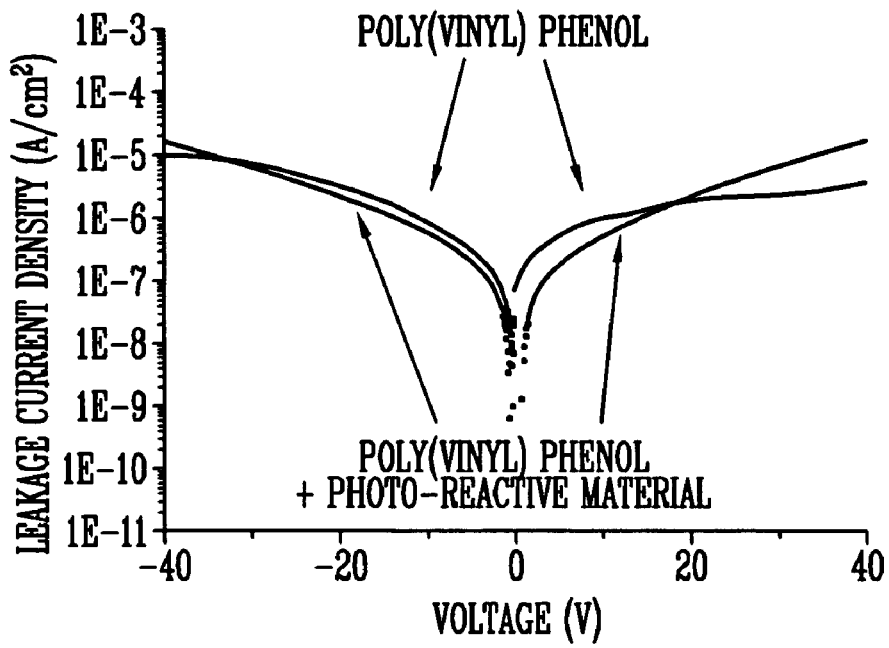
FIG. 3 is a graph of leakage current density vs voltage of poly (vinyl) phenol in response to both cases of having a photo-reactive material contained and not contained.

As can be seen from FIG. 3, when the poly (vinyl) phenol having no photo-reactive materials added and the photo-reactive poly (vinyl) phenol thin layer (Example 1) in which the photo-reactive material was added were compared to each other, there was no change in the insulating characteristic even when the photo-reactive material was added.

Figure 4A:
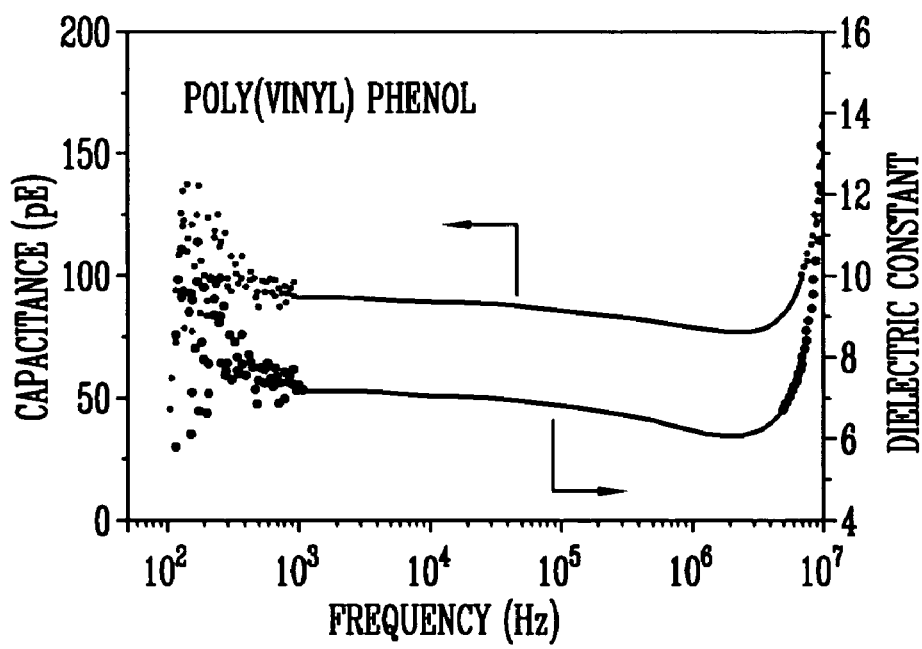
FIGS. 4A and 4B are graphs of capacitance vs voltage of poly (vinyl) phenol in response to both cases of having a photo-reactive material contained and not contained.
Figure 4B:
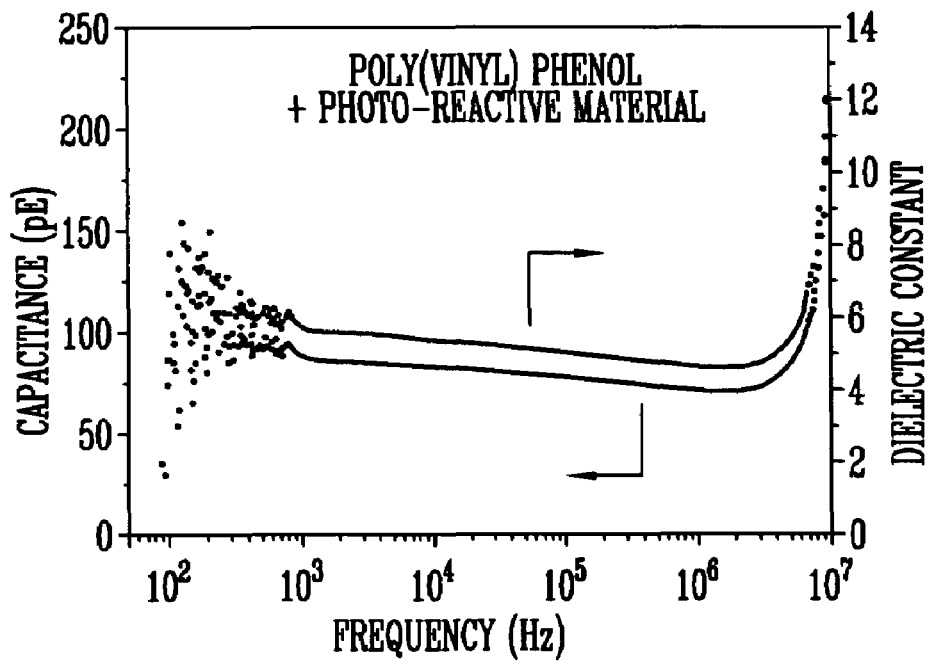

In addition, as can be seen from FIGS. 4A an 4B, both cases of the poly (vinyl) phenol thin layer having no photo-reactive materials added and the photo-reactive poly (vinyl) phenol thin layer (Example 1) in which the photo-reactive material was added showed typical characteristic curves observed in a general insulating layer material. That is, there were no phenomena such that a capacitance value is significantly changed in response to a sweep voltage or a capacitance hysteresis curve is changed in response to a direction of the sweep voltage. Furthermore, it was found that a dielectric loss is lowered when the photo-reactive material is added.

Measurement of current transfer characteristic

Figure 5:
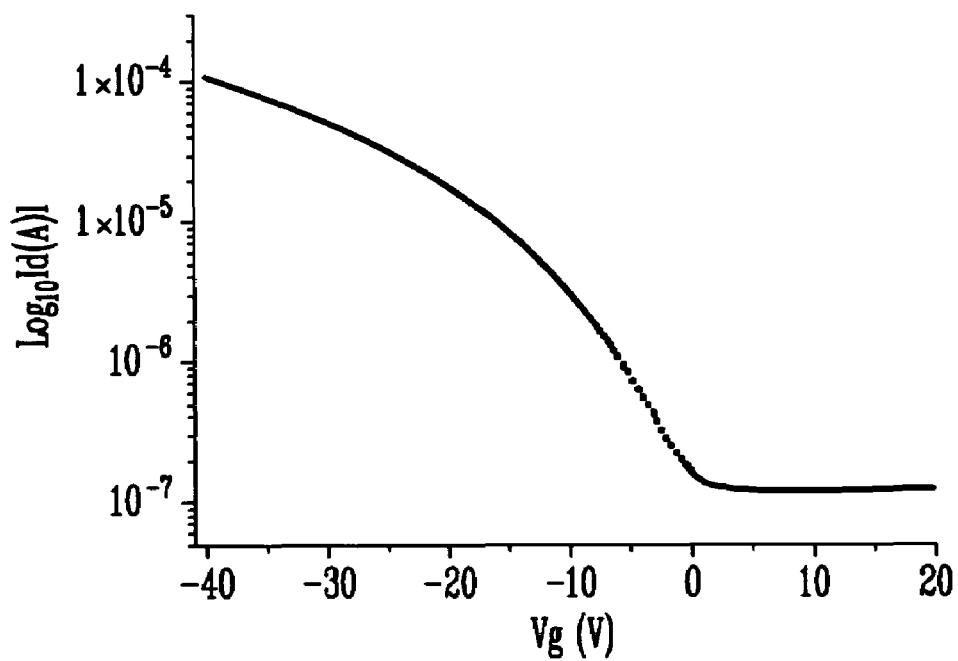
FIG. 5 is a graph illustrating a current transfer characteristic curve measured using an organic thin film transistor in accordance with a Example 1 of the present invention.

The current transfer characteristic of the organic thin film transistor fabricated in the Example 1 was measured by a semiconductor parameter analyzer 4145A (fabricated by Hewlett-Packard Co.) And shown in FIG. 5.

According to the photo-reactive organic polymeric gate Insulating layer composition and the organic thin film transistor using the Same of the present invention have the following effects.

First, an organic polymeric dielectric having a high dielectric Rate to which a photo-lithography process is applied can be employed as the Gate insulating layer.

Second, there is no change in the electrical characteristic in response to addition of the photo-reactive material into the polymeric dielectric, and a dielectric loss can be lowered when the photo-reactive material is added.

Third, the photo-lithography process is used to form the gate insulating layer instead of a conventional lift-off process or a dry etching process, thereby implementing fine patterning of the organic thin layer.

Fourth, the organic insulating layer capable of being formed at a low temperature is provided to minimize influences on the pre-process layer, thereby enhancing an application of the organic thin film transistor.

Although exemplary embodiments of the present invention have been described with reference to the attached drawings, the present invention is not limited to these embodiments, and it should be appreciated to those skilled in the art that a variety of modifications and changes can be made without departing from the spirit and scope of the present invention.

What is claimed is:

1. An organic thin film transistor comprising:
a substrate;
a gate electrode;
a photo-reactive polymeric gate insulating layer comprising:
poly (vinyl) phenol represented by the following chemical formula I:

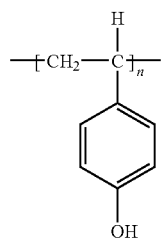

where n is ten or more; and
a photo-reactive material of 0.1% or more based on weight of poly (vinyl) phenol admixed with the poly (vinyl) phenol to form the photo-reactive organic polymeric gate insulator layer as a single layer wherein the photo-reactive material is selected from a group consisting of
2,6-bis(4-azidobenzylidene)cyclohexanone;
2,6-bis(4-azidobenzylidene)-4-methylcyclohexanone;
4,4-diazidostilbene-2,2'-disulfonic acid disodium salt;
ammonium dichromate;
2-methyl-1-[4-(methylthio)phenyl]-2-(4-morpholinyl)-1-propanone;
2-methyl-1[4-(methylthio)phenyl]-2-morpholino-propane-1-one;
2-hydroxy-2-methyl-1-phenyl-propane-1-one;
a mixed initiator of 50 wt % of 1-hydroxy-cyclohexyl-phenyl-ketone and 50 wt % of benzophenone;
a mixed initiator of 20 wt % of 1-hydroxy-cyclohexyl-phenyl-ketone and 80 wt % of 2-hydroxy-2-methyl-1-phenyl-propane-1-one;
2-hydroxy-1-[4-(2-hydroxyethoxy)phenyl]-2-methyl-1-propanone;
methylbenzoylformate;
alpha, alpha-dimethoxy-alpha-phenylacetophenone;
2-benzyl-2-(dimethylamino)-1-[4-(4-morpholinyl) phenyl]-1-butanone;
a mixed initiator of 30 wt % of 2-benzyl-2-(dimethylamino)-1-[4-(4-morpholinyl)phenyl]-1-butanone and 70 wt % of 2,2-dimethoxy-1,2-diphenylethan-1-one;
diphenyl (2,4,6-trimethylbenzoyl)-phosphine oxide;
a mixed initiator of 50 wt % of diphenyl (2,4,6-trimethylbenzoyl)-phosphine oxide and 50 wt % of 2-hydroxyl-2-methyl-1-phenyl-propane-1-one;
a phosphine oxide;
bis (2,4,6-trimethylbenzoyl)-phenylphosphineoxide;
a mixed initiator of 5 wt % of bis (2,4,6-trimethylbenzoyl)-phenyiphosphineoxide and 95 wt % of 2-hydroxy-2-methyl-1-phenyl-propane-1-one;
a mixed initiator of 10 wt % of bis (2,4,6-trimethylbenzoyl)-phenyiphosphineoxide and 9 wt % of 2-hydroxy-2-methyl-1-phenyl-propane-1-one;
a mixed initiator of 20 wt % of bis (2,4,6-trimethylbenzoyl)-phenyiphosphineoxide and 80 wt % of 2-hydroxy-2-methyl-1-phenyl-propane-1-one;
bis(etha 5-2,4-cyclopentadiene-1-yl)bis[2,6-difluoro-3-(1H-pyrrole-1-yl)phenyl] titanium; and
a mixed initiator of benzophenone;
an organic active layer; and
source and drain electrodes.

2. The organic thin film transistor according to claim 1, having a structure that the gate electrode, the gate insulating layer, the organic active layer, and source and drain electrodes are sequentially stacked on the substrate.

3. The organic thin film transistor according to claim 1, having a structure that the gate electrode, the gate insulating layer, source and drain electrodes, and the organic active layer are sequentially stacked on the substrate.

4. The organic thin film transistor according to claim 1, wherein the gate insulating layer is patterned by a lithography process.

5. The organic thin film transistor according to claim 1 wherein the gate electrode is selected from the group consisting of gold, silver, nickel, indium-tin-oxide, aluminum, titanium, titanium nitride and chromium.

6. The organic thin film transistor according to claim 1 wherein the organic active layer is selected from the group consisting of pentacene, dihexyl-sexithiophene (DH6T), poly (3-hexylthiophene) regioregular (P3HT), poly-9,9-dioctylfluorene-co-bithiophene (F8T2), and dihexylanthradithiophene (DHADT).

7. The organic thin film transistor according to claim 1 wherein the substrate comprises poly(ether sulfone).

8. An organic thin film transistor comprising:
a substrate;
a gate electrode;
a photo-reactive polymeric gate insulating layer comprising:
poly (vinyl) phenol represented by the following chemical formula I:

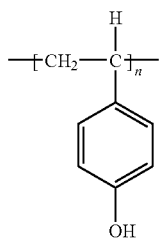

where n is ten or more; and a photo-reactive material of 0.1% or more based on weight of poly (vinyl) phenol admixed with the poly(vinyl) phenol to form the photo-reactive organic polymeric gate insulator layer as a single layer wherein the photo-reactive material is selected from a group consisting of 2,6-bis(4-azidobenzylidene)cyclohexanone;
2,6-bis(4-azidobenzylidene)-4-methylcyclohexanone;
4,4-diazidostilbene-2, 2'-disulfonic acid disodium salt;
ammonium dichromate;
2-methyl-1-[4-(methylthio) phenyl]-2-(4-morpholinyl)-1-propanone;
2-methyl-1-[4-(methylthio)phenyl]-2-morpholinopropane-1-one;
2-hydroxy-2-methyl-1-phenyl-propane-1-one;
a mixed initiator of 20 wt % of 1-hydroxy-cyclohexyl-phenyl-ketone and 80 wt % of 2-hydroxy-2-methyl-1-phenyl-propane-1-one;
2-hydroxy-1-[4-(2-hydroxyethoxy)phenyl]-2-methyl-1-propanone;
methylbenzoylformate;
alpha, alpha-dimethoxy-alpha-phenylacetophenone;
2-benzyl-2-(dimethylamino)-1-[4-(4-morpholinyl)phenyl]-1-butanone;
a mixed initiator of 30 wt % of 2-benzyl-2-(dimethylamino)-1-[4-(4-morpholinyl)phenyl]-1-butanone and 70 wt % of 2,2-dimethoxy-1,2-diphenylethan-1-one;
diphenyl (2,4,6-trimethylbenzoyl)-phosohine oxide;
a mixed initiator of 50 wt % of diphenyl (2,4,6-trimethylbenzoyl)-phosphine oxide and 50 wt % of 2-hydroxy-2-methyl-1-phenyl-propane-1-one;
a phosphine oxide;
bis (2,4,6-trimethylbenzoyl)-phenylphosphineoxide;
a mixed initiator of 5 wt % of bis (2,4,6-trimethylbenzoyl)-phenylphosphineoxide and 95 wt % of 2-hydroxy-2-methyl-1-phenyl-propane-1-one;
a mixed initiator of 10 wt % of bis (2,4,6-trimethylbenzoyl)-phenylphosphineoxide and 9 wt % of 2-hydroxy-2-methyl-1-phenyl-propane-1-one;
a mixed initiator of 20 wt % of bis (2,4,6-trimethylbenzoyl)-phenylphosphineoxide and 80 wt % of 2-hydroxy-2-methyl-1-phenyl-propane-1-one; and
bis(etha 5-2,4-cyclopentadiene-1-yl)bis[2,6-difluoro-3-(1H-pyrrole-1-yl)phenyl]titanium;
an organic active layer; and
source and drain electrodes.

9. The organic thin film transistor according to claim 8, having a structure that the gate electrode, the gate insulating layer, the organic active layer, and source and drain electrodes are sequentially stacked on the substrate.

10. The organic thin film transistor according to claim 8, having a structure that the gate electrode, the gate insulating layer, source and drain electrodes, and the organic active layer are sequentially stacked on the substrate.

11. The organic thin film transistor according to claim 8, wherein the gate insulating layer is patterned by a lithography process.

12. The organic thin film transistor according to claim 8 wherein the gate electrode is selected from the group consisting of gold, silver, nickel, indium-tin-oxide, aluminum, titanium, titanium nitride and chromium.

13. The organic thin film transistor according to claim 8 wherein the organic active layer is selected from the group consisting of pentacene, dihexyl-sexithiophene (DH6T), poly (3-hexylthiophene) regioregular (P3HT), poly-9,9-dioctylfluorene-co-bithiophene (F8T2), and dihexylanthradithiophene (DHADT).

14. The organic thin film transistor according to claim 8 wherein the substrate comprises poly(ether sulfone).

* * * * *